United States Patent [19]

Krinsky et al.

[11] Patent Number: 4,971,417
[45] Date of Patent: Nov. 20, 1990

[54] RADIATION-HARDENED OPTICAL REPEATER

[75] Inventors: Jeffrey A. Krinsky, Renton; Raymond D. Rempt, Woodinville, both of Wash.

[73] Assignee: The Boeing Company, Seattle, Wash.

[21] Appl. No.: 397,713

[22] Filed: Aug. 23, 1989

[51] Int. Cl.$^5$ .......................... G02B 6/26; G02F 1/00; H03F 7/00

[52] U.S. Cl. .............................. 350/96.15; 350/96.16; 350/96.30; 350/96.34; 350/311; 455/601; 455/608; 455/609; 455/610; 455/612; 307/425; 307/430

[58] Field of Search ............... 350/96.10, 96.11, 96.15, 350/96.16, 96.18, 96.30, 96.34, 311, 353, 354, 96.17, 96.20, 96.23, 96.29, 96.13, 96.14; 455/601, 609, 617, 618, 619, 612, 613; 307/425, 428, 430; 250/227.11; 357/17, 19, 30; 372/6, 18, 19, 43

[56] References Cited

U.S. PATENT DOCUMENTS

| Re. 28,753 | 3/1976 | Zavodny | 331/94.5 C |
|---|---|---|---|
| 3,532,889 | 10/1970 | Kompfner | 455/617 X |
| 3,599,106 | 8/1971 | Snitzer | 330/4.3 |
| 3,628,045 | 12/1971 | Chesler | 307/88.3 |
| 3,675,039 | 7/1972 | Boyd et al. | 307/88.3 |
| 4,015,217 | 3/1977 | Snitzer | 331/94.5 E |
| 4,236,243 | 11/1980 | Davies et al. | 370/3 |
| 4,493,086 | 1/1985 | Jain et al. | 372/21 |
| 4,515,429 | 5/1985 | Smith et al. | 350/96.34 X |
| 4,588,957 | 5/1986 | Balant et al. | 330/4.3 |
| 4,644,556 | 2/1987 | Petuchowski et al. | 372/97 |
| 4,645,915 | 2/1987 | Van Ruyven | 235/473 |
| 4,680,767 | 7/1987 | Hakimi et al. | 372/6 |
| 4,682,335 | 7/1987 | Hughes | 372/6 |
| 4,760,577 | 7/1988 | Aoshima | 372/25 |
| 4,769,820 | 9/1988 | Holmes | 372/33 |
| 4,859,015 | 8/1989 | Krinsky et al. | 350/96.15 |
| 4,886,334 | 12/1989 | Aoki | 350/96.15 |
| 4,909,585 | 3/1990 | Kobayashi et al. | 350/96.16 |
| 4,913,507 | 4/1990 | Stamnitz et al. | 350/96.15 |

OTHER PUBLICATIONS

"Laser Amplifier Repeater Passes Test in 75-Mile Fiber Link," *Electronic Engineering Times*, Apr. 27, 1987.

Primary Examiner—Brian Healy
Attorney, Agent, or Firm—Christensen, O'Connor, Johnson & Kindness

[57] ABSTRACT

An optical repeater that amplifies and reshapes an input pulse without converting the pulse into the electrical domain. The repeater comprises an optical gain device, a mode selector, and an optical thresholding material. The optical gain device comprises an optical gain material with anti-reflection coatings at its input and output ports. The mode selector receives an optical signal amplified by the gain medium, and preferentially transmits one or more preselected spatial modes to the thresholding material, which shapes the pulses for retransmission.

14 Claims, 2 Drawing Sheets

RADIATION-HARDENED OPTICAL REPEATER

FIELD OF THE INVENTION

The present invention relates to optical communications and, in particular, to an optical repeater for amplifying and shaping pulses in an optical communication system.

BACKGROUND OF THE INVENTION

Two major problems encountered in long-haul fiber-optic communication systems are pulse spreading and attenuation. Pulse spreading is caused by chromatic and modal dispersion, and attenuation is caused by losses in the transmission medium. Modal dispersion can be eliminated by the use of single-mode fibers. Chromatic dispersion can be reduced by using a narrow-band source, a low-dispersion fiber, a dispersion-shifted fiber in combination with a source close to the zero dispersion wavelength, or a dispersion transformer. Attenuation can be reduced by careful selection of operating wavelengths and fibers. However, even with state-of-the art selections, there are limits to the distance over which a fiber-optic cable can carry a signal, and on the bandwidth-distance product of fiber-optic data links.

One method to increase the distance over which a fiber-optic data link can operate, as well as increasing the distance-bandwidth product, is to use repeaters along the communication link. A repeater is a device that receives the optical signal, amplifies it, and then retransmits it. In addition, a repeater may also perform pulse shaping. Currently used repeaters for fiber-optic communications systems operate by converting received optical input pulses into corresponding electrical signals, then amplifying and shaping the pulses in the electric domain, and finally converting the modified pulses back into an optical signal for retransmission. Pulse amplification is most important when optical losses are the dominant problem with the data link. If dispersion is a problem, reshaping of the pulses can result in significant improvements in reliable data transmission.

There are two principal difficulties with conventional repeaters that rely on conversion of the optical pulses to the electrical domain. First, the relatively slow speed of electrical components limits the speed at which the repeater can operate. Second, the use of electrical components tends to increase the susceptibility of the repeater to radiation induced noise. Susceptibility to radiation, such as ionizing radiation, can be minimized only by relatively cumbersome and expensive designs. There is therefore a need for a repeater for fiber-optic communication systems that avoids the use of electronic components in the signal path.

SUMMARY OF THE INVENTION

The present invention provides an optical repeater that can both amplify an optical pulse and reshape the pulse, without converting the pulse into the electrical domain. The invention therefore provides significant advantages for operation in an ionizing radiation environment. In addition, the present invention avoids the propagation delays associated with electrical circuitry. The invention has applications in long haul data links for telecommunication applications, long haul data links that require radiation hardness, and data links that must survive large doses of ionizing radiation.

The optical repeater receives an optical input signal, and produces a corresponding optical output signal. In a preferred embodiment, the repeater comprises an optical gain device, a mode selector, and optical thresholding means. The optical gain device comprises an optical gain medium for amplifying the input signal to produce an amplified input signal. The gain medium has an optical input port through which the input signal may be received into the gain medium, and an output port through which the amplified input signal may leave the gain medium. Both ports include anti-reflection means.

The mode selector receives the amplified input signal, and preferentially transmits one or more preselected spatial modes to produce a mode selected signal. The optical thresholding means receives the mode selected signal, and includes means for producing the output signal when the intensity of the mode selected signal exceeds a threshold. The optical thresholding means thereby performs a pulse shaping function. The optical thresholding means may comprise a non-linear optical material such as poly-di-acetylene.

Other described embodiments include one that does not include mode selection means, and those in which the mode selection means comprises a single mode fiber-optic cable or a spatial filter. When a spatial filter is used, the optical thresholding means may comprise a non-linear optical material positioned in the spatial filter, such that the power incident on the non-linear optical material may be varied. Use of feedback to control the pumping of the optical gain medium is also disclosed.

DETAILED DESCRIPTION OF THE INVENTION

Figure 1:
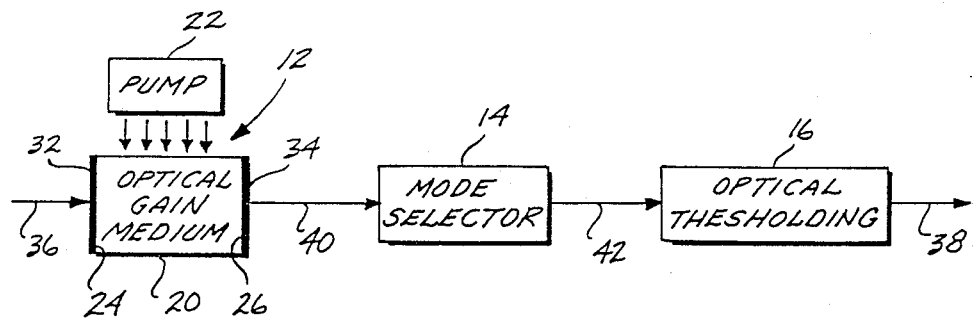
FIG. 1 is a schematic diagram of a preferred embodiment of the present invention.

FIG. 1 sets forth a schematic diagram of a preferred embodiment of the optical repeater of the present invention. The repeater comprises optical gain device 12, mode selector 14, and optical thresholding device 16. Optical gain device 12 comprises optical gain medium 20, pump 22, optical input port 24, and optical output port 26. The input and output ports are provided with antireflection coatings 32 and 34, respectively. Other anti-reflection means may also be used. The repeater receives an optical input signal 36, such as from a fiber-optic transmission line, and produces an output signal 38 for transmission to the next repeater or to a receiver. The input optical signal comprises a series of pulses representing data bits, and the repeater amplifies and shapes each pulse to produce the output signal.

Optical gain device 12 receives the optical input signal 36, and amplifies the input signal to produce an amplified signal 40 that is received by mode selector 14. The mode selector passes one or more preselected spatial modes of the amplified signal, while attenuating other spatial modes. The mode selector thereby produces a mode-selected signal 42 that is received by optical thresholding device 16. The optical thresholding device comprises a nonlinear optical material that produces an output signal only when an input signal to the device exceeds a predetermined threshold. The optical thresholding device thereby performs a pulse-shaping function that produces narrower and higher pulses for retransmission down an optical communication link.

In a preferred embodiment, optical gain device 12 may be constructed in a manner similar to that of a laser diode. In such a construction, pump 22 provides an electrical current to optical gain medium 20, resulting in a population inversion within the optical gain medium. Each optical pulse entering the optical gain medium through input port 24 will be amplified as it traverses the optical gain medium. However, because of anti-reflection coating 34, most of the energy of the amplified pulse will pass through output port 26 to the mode selector. Thus unlike a laser in which light undergoes multiple reflections and makes multiple passes through the optical gain medium, optical gain device 12 is constructed so as to minimize the number of passes of the light through the gain medium. In a preferred and idealized limit, all of the light in the input pulse entering via input port 24, and all light generated within the optical gain medium in response to the input pulse, will exit through output port 26 without reflection. Multiple passes through the gain medium are undesirable, since they result in the spreading of pulses, and the production of time-delayed copies of pulses.

Mode selector 14 preferably comprises a single-mode fiber-optic cable that transmits only a single spatial mode. However, low numerical aperture (NA) fiber-optic cables, spatial filters, optical waveguides, and other mode selectors may be used. For an ionizing radiation or EMI environment, the purpose and advantage of the mode selector can be seen by considering the different sources of the light that pass through output port 26. These sources include (1) an amplified version of the input signal 36; (2) noise induced in the gain medium, e.g., noise produced by ionizing radiation; and (3) noise caused by spontaneous emission in the optical gain medium. At the output of the gain medium, the amplified input signal will be by far the major contributor to the proper spatial mode that will be selected by the mode selector.

Considered from another point of view, radiation generated by ionizing radiation or other noise sources in optical gain medium 20 will be produced in random directions, and thus will be substantially uniformly distributed over a full $4\pi$ steradians. Therefore, only a small fraction of the noise will be emitted in the proper direction so that it passes through output port 26 and avoids attenuation by the mode selector. Even if the ionizing radiation originated from a burst and thus had a preferred direction, the amount of the resulting optical radiation that would have the spatial angle required by the mode selector would be very low. Furthermore, as long as an adequate population increase is maintained, the preferential gain of the input signal will ensure that the optical power of the amplified, mode selected input signal will be much larger than optical power due to any ionizing radiation or other noise source that may be present. The result is that the output signal due to the amplified input signal will be much larger relative to the output signal due to noise, resulting in a larger signal-to-noise ratio than if the gain medium had not been used. While the use of an optical gain device in combination with an optical thresholding device, without a mode selector, may be suitable for some applications, such a combination will not function well in an ionizing radiation or EMI environment, since the ionizing radiation or EMI will introduce excessive noise into the optical gain device.

Figure 2A:
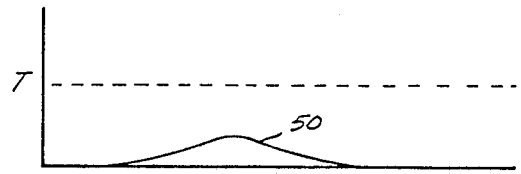
FIGS. 2A-2C are graphs showing the shape of an optical pulse at various points in the repeater.
Figure 2B:
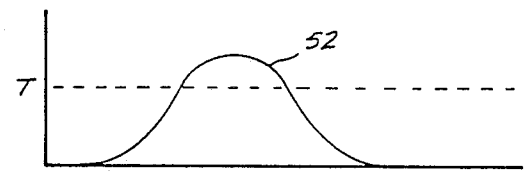
Figure 2C:
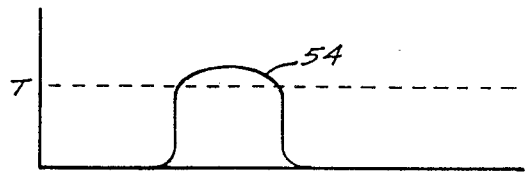

Optical thresholding device 16 comprises a nonlinear optical thresholding material, such as poly-di-acetylene. Such material begins to transmit light or otherwise pass light to an output port only when the light falling on it exceeds a predetermined threshold. With reference to FIGS. 2A–2C, reference numeral 50 in FIG. 2A represents an optical pulse received by optical gain device 12 at input port 24. Reference numeral 52 in FIG. 2B represents the same pulse after amplification by the optical gain device. As illustrated, the result of the amplification is to increase the pulse height such that it exceeds threshold T. FIG. 2C illustrates the action of the optical thresholding device. In particular, the output of the optical thresholding device is substantially zero except when pulse 52 exceeds threshold T, thereby producing an output pulse 54 with steeper rise and fall times.

Figure 3:
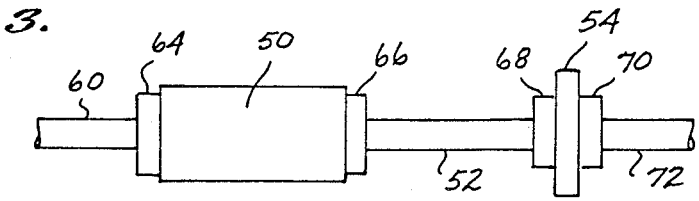
FIG. 3 is a schematic diagram of a second embodiment of the invention.

Further details of a preferred embodiment of the invention are set forth in FIG. 3. This embodiment includes an optical gain device that includes optical gain medium 50, single mode fiber-optic cable 52, and optical thresholding material 54. The input signal is received on fiber-optic cable 60, and is coupled into optical gain medium 50 by a quarter pitch GRIN lens 64 or an equivalent selfoc, device. The amplified device signal exiting from optical gain medium 50 is coupled into single mode fiber-optic cable 52 by GRIN lens 66. In this embodiment, single mode fiber-optic cable 52 provides the mode selection function. The single mode amplified optical signal is coupled into optical thresholding material 54 by GRIN lens 68, and GRIN lens 70 couples the shaped pulses into output fiber-optic cable 72.

Figure 4:
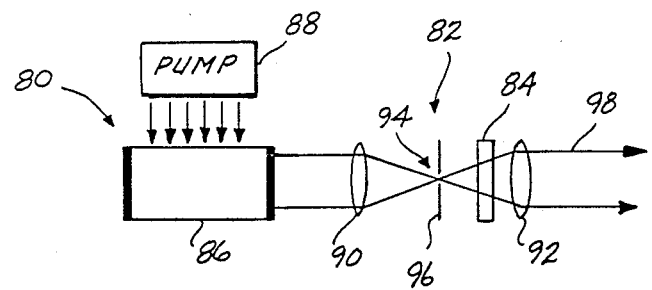
FIG. 4 is a schematic diagram of a third embodiment of the invention.

Further features of the invention are illustrated by the embodiment shown in FIG. 4. This embodiment includes optical gain device 80, spatial filter 82 and optical thresholding material 84. The optical gain device comprises optical gain medium 86 and pump 88, as in the embodiment of FIG. 1. Spatial filter 82 performs the mode selection function, and comprises converging lenses 90 and 92 and pinhole 94 formed in aperature 96. The pinhole is positioned at the focal point of lens 90, such that aperature 96 blocks higher spatial modes of the beam. The mode selected light emerging from the pinhole then passes through optical thresholding material 84, and light passing through the optical thresholding material is collimated by lens 92 to produce output beam 98 that may be coupled into a fiber-optic cable for retransmission.

The advantage of positioning optical thresholding material 84 between pinhole 94 and lens 92 is that by varying the position of the optical thresholding material along the optical axis of the spatial filter, the intensity of the light striking the optical thresholding material may be conveniently varied. This arrangement is particularly useful in cases where the input pulses may vary widely in signal strength.

Figure 5:
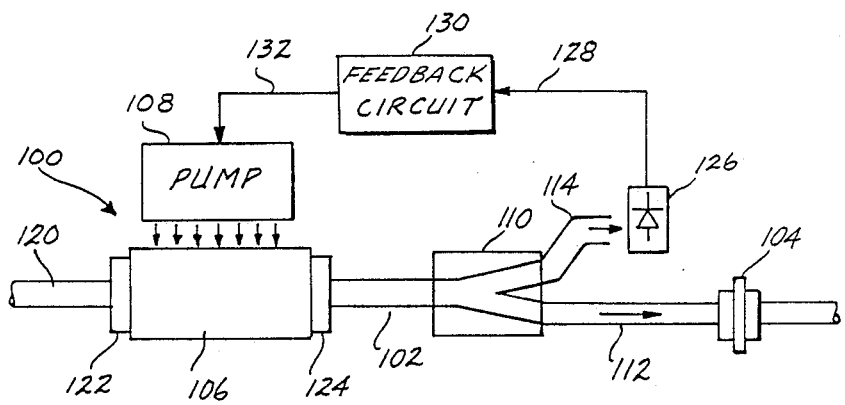
FIG. 5 is a schematic diagram of a fourth embodiment of the invention.

A further embodiment of the invention is set forth in FIG. 5. This embodiment includes optical gain device 100, single mode fiber-optic cable 102 and optical thresholding material 104. Optical gain device 100 comprises optical gain medium 106 and pump 108. Fiber-optic cable 102 as connected to coupler 110 that divides the amplified optical signal on fiber-optic cable 102 between main branch 112 and feedback branch 114.

The optical input signal on fiber-optic cable 120 is coupled by GRIN lens 122 into optical gain medium 106. The amplified optical signal is then coupled into fiber-optic cable 102 by GRIN lens 124. Most of the energy of the amplified signal is coupled into main branch 112, and passes to optical thresholding material 104, as in the embodiment of FIG. 3. However, a portion of the energy of the amplified optical signal is coupled into feedback branch 114. This signal falls on photodetector 126, and the photodetector converts the optical signal into an electronic feedback signal on line 128 that is connected to feedback circuit 130. The feedback circuit generates a control signal on line 132 that is received by pump 108. Pump 108 uses the control signal to regulate the degree of pumping provided to the optical gain medium. For example, for an embodiment in which the optical gain device has the general construction of a laser diode, pump 108 would regulate the current provided to the optical gain medium in accordance with the control signal, so as to cause the amplified optical signal on fiber-optic cable 102 to have a predetermined amplitude. Thus in this arrangement, the relative strength of the signal falling on the optical thresholding material can be held substantially constant, resulting in a more uniform pulse shaping operation.

The described feedback technique is in many ways analogous to an automatic gain control circuit. However, the technique does not require a response time as fast as that of the optical input signal. The feedback arrangement allows for varied amplification in the event that the input signal varies in amplitude due to radiation induced attenuation of the fiber-optic transmission system, degradation of the transmitter, contamination of the connections between optical fibers, or other causes.

The feedback technique shown in FIG. 5 could be implemented in other ways. For example, the feedback system could be arranged to sense the symmetry of the amplified pulses, rather than their amplitude. Another variation of the arrangement shown in FIG. 5 makes use of an optical gain medium that is saturable, such that the maximum strength of the amplified signal is held to a predetermined value. This method has an advantage over the active feedback technique, since it is simpler to implement. However, use of a saturable gain medium must be carefully applied, because if the noise is large and the gain is too high, the noise may be amplified to the saturation value along with the signal. Yet another variation is to place a coupler such as coupler 110 after (i.e., downstream of) optical thresholding material 104, such that the feedback signal on line 128 provides a measure of the output signal rather than of the amplified input signal. Such a variation is advantageous because it automatically compensates for variations in the threshold of the optical thresholding material due to temperature variation, aging, and similar effects. The use of feedback based on the output signal can be in addition to or in place of feedback based on the amplified input signal.

If an optical communication system has a significant amount of out-of-band noise, such noise can alter the power falling on the optical thresholding material, thus causing the thresholding material to transmit even though the in-band signal is lower than the threshold. To avoid this, narrow band interference filters, or other wavelength selecting devices such as gratings, prisms and the like, can be placed in the signal path of the repeater, to provide additional noise immunity. This technique would be especially useful for reducing the noise due to radiation induced fluorescence. Such fluorescence has been documented in optical fibers, and has a relatively broad bandwith. Combinations of wavelength selective devices could also be used. The filters can be placed before or after amplification by the optical gain device, and before or after the thresholding, or at all such locations.

While the preferred embodiments of the invention have been described, variations will be apparent to those skilled in the art. Accordingly, the scope of the invention is to be determined by reference to the following claims.

The embodiments of the invention in which an exclusive property or privilege is claimed are defined as follows:

1. An optical repeater for receiving an optical input signal and producing a corresponding optical output signal, the repeater comprising:
   an optical gain device for amplifying the input signal to produce an amplified input signal, the optical gain device comprising an optical gain medium, an optical input port through which the input signal may be received into the optical gain medium, and an optical output port through which the amplified input signal may leave the optical gain medium, the optical gain device further comprising antireflection means associated with the input and output ports to minimize reflections at such ports; and
   optical thresholding means coupled to receive the amplified input signal, the optical thresholding means including means for producing the output signal when the intensity of the amplified input signal exceeds a threshold.

2. The repeater of claim 1, wherein the optical thresholding means comprises a nonlinear optical material.

3. The repeater of claim 2, wherein the nonlinear optical material comprises poly-di-acetylene.

4. The repeater of claim 1, wherein the optical gain device further comprises a pump for pumping the optical gain medium, and wherein the repeater further comprises means for controlling the pump so as to cause the amplified input signal to have a predetermined level.

5. The repeater of claim 4, further comprising means for producing a feedback signal having a strength proportional to the strength of the amplified input signal, and wherein the means for controlling the pump is responsive to the feedback signal to cause the amplified input signal to have the predetermined level.

6. The repeater of claim 4, further comprising means for producing a feedback signal having a strength proportional to the strength of the output signal, and wherein the means for controlling the pump is responsive to the feedback signals to cause the output signal to have a predetermined level.

7. The repeater of claim 1, further comprising a mode selector coupled to the optical gain device so as to receive the amplified input signal, the mode selector comprising means for preferentially transmitting one or more preselected spatial modes of the amplified input signal to produce a mode selected signal, and wherein the optical thresholding means is coupled to receive the mode selected signal and includes means for producing the output signal when the intensity of the mode selected signal exceeds a threshold.

8. The repeater of claim 7, wherein the optical thresholding means comprises a nonlinear optical material.

9. The repeater of claim 8, wherein the nonlinear optical material comprises poly-di-acetylene.

10. The repeater of claim 7, wherein the mode selector comprises a single mode fiber-optic cable.

11. The repeater of claim 7, wherein the mode selector comprises a spatial filter comprising first and second lenses and a pinhole forming aperture positioned therebetween, and wherein the optical thresholding means comprises a nonlinear optical material positioned between the lenses, whereby the optical power incident on the non-linear optical material may be varied by varying the position of the non-linear optical material relative to the lenses.

12. The repeater of claim 7, wherein the optical gain device further comprises a pump for pumping the optical gain medium, and wherein the repeater further comprises means for controlling the pump so as to cause the amplified input signal to have a predetermined level.

13. The repeater of claim 12, further comprising means for producing a feedback signal having a strength proportional to the strength of the amplified input signal, and wherein the means for controlling the pump is responsive to the feedback signal to cause the amplified input signal to have the predetermined level.

14. The repeater of claim 13, further comprising means for producing a feedback signal having a strength proportional to the strength of the output signal, and wherein the means for controlling the pump is responsive to the feedback signals to cause the output signal to have the predetermined level.

* * * * *